(12) United States Patent  
Patra

(10) Patent No.: US 12,339,589 B2
(45) Date of Patent: Jun. 24, 2025

(54) DIGITAL MICROMIRROR DEVICE FOR AN ILLUMINATION OPTICAL COMPONENT OF A PROJECTION EXPOSURE SYSTEM

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 205 days.

(21) Appl. No.: 18/175,195

(22) Filed: Feb. 27, 2023

(65) Prior Publication Data

US 2023/0221649 A1 Jul. 13, 2023

Related U.S. Application Data

(63) Continuation of application No. PCT/EP2021/076561, filed on Sep. 28, 2021.

(30) Foreign Application Priority Data

Sep. 30, 2020 (DE) .......................... 102020212351.9

(51) Int. Cl.
  *G03F 7/20* (2006.01)
  *G02B 26/08* (2006.01)
  *G03F 7/00* (2006.01)

(52) U.S. Cl.
  CPC ..... *G03F 7/70275* (2013.01); *G02B 26/0833* (2013.01); *G03F 7/70116* (2013.01)

(58) Field of Classification Search
  CPC ............. G03F 7/70275; G03F 7/70116; G03F 7/70075; G02B 26/0833; G02B 5/09; G02B 5/0891
  See application file for complete search history.

(56) References Cited

U.S. PATENT DOCUMENTS 6,573,978 B1 6/2003 McGuire, Jr.
2006/0132747 A1 6/2006 Singer et al.
(Continued)

FOREIGN PATENT DOCUMENTS

DE 10 2008 009 600 A1 8/2009
DE 10 2015 208 512 A1 3/2016
(Continued)

OTHER PUBLICATIONS

Translation of International search report for corresponding PCT Appl No. PCT/EP2021/076561, dated Mar. 14, 2022.
(Continued)

*Primary Examiner* — Mesfin T Asfaw
(74) *Attorney, Agent, or Firm* — Fish & Richardson P.C.

(57) ABSTRACT

A micromirror array is a constituent part of an illumination-optical component of a projection exposure apparatus for projection lithography. A multiplicity of micromirrors are in groups in a plurality of mirror modules, each of which has a rectangular module border. The mirror modules are in module columns. At least some of the module columns are displaced with respect to one another along a column boundary line so that at least some of the mirror modules adjacent to one another over the boundary line are arranged displaced with respect to one another. Their module border sides running transversely to the boundary line are not aligned flush with one another. This micromirror array can have a relatively standardized production and can have a relatively small reflection folding angle on the object if the micromirror array represents a final illumination-optical component upstream of a reflective object to be illuminated.

20 Claims, 5 Drawing Sheets

(56) References Cited

U.S. PATENT DOCUMENTS

2011/0001947 A1\* 1/2011 Dinger .................. G02B 26/06
            359/849
2018/0074303 A1  3/2018 Schwab

FOREIGN PATENT DOCUMENTS

| DE | 10 2017 220 586 A1 | 5/2019 |
| EP | 1 614 008 B1 | 12/2009 |
| WO | WO 2009/100856 A1 | 8/2009 |
| WO | WO 2010/099807 A1 | 9/2010 |
| WO | WO 2013/167409 A1 | 11/2013 |
| WO | WO 2015/028451 A1 | 3/2015 |

OTHER PUBLICATIONS

German Office Action, with translation thereof, for corresponding DE Appl No. 10 2020 212 351.9, dated Mar. 5, 2021.

\* cited by examiner

DIGITAL MICROMIRROR DEVICE FOR AN ILLUMINATION OPTICAL COMPONENT OF A PROJECTION EXPOSURE SYSTEM

CROSS-REFERENCE TO RELATED APPLICATIONS

The present application is a continuation of, and claims benefit under 35 USC 120 to, international application PCT/EP2021/076561, filed Sep. 28, 2021, which claims benefit under 35 USC 119 of German Application No. 10 2020 212 351.9, filed Sep. 30, 2020. The entire disclosure of each of these applications is incorporated by reference herein.

FIELD

The disclosure relates to a micromirror array for an illumination-optical component of a projection exposure apparatus. Additionally, the disclosure relates to an illumination-optical component comprising such a micromirror array, an optical assembly comprising such an illumination-optical component, an illumination optical unit comprising such an illumination-optical component or comprising such an optical assembly, an optical system comprising such an illumination optical unit, an illumination system comprising such an illumination optical unit or comprising such an optical system, a projection exposure apparatus for projection lithography comprising such an illumination system, a method for producing a microstructured or nanostructured component with the aid of such a projection exposure apparatus, and a microstructured or nanostructured component produced using such a method.

BACKGROUND

A micromirror array is known from WO 2015/028 451 A1, WO 2013/167 409 A1, and WO 2009/100 856 A1.

SUMMARY

The present disclosure seeks to develop a micromirror array for an illumination-optical component of a projection exposure apparatus, in such a way that, firstly, a micromirror array production that is relatively standardized, and, secondly, a relatively small reflection folding angle is realizable on the object using the micromirror array, in the event that the latter represents a final illumination-optical component upstream of a reflective object to be illuminated.

In an aspect, the disclosure provides a micromirror array for an illumination-optical component of a projection exposure apparatus for projection lithography, comprising a multiplicity of micromirrors, which are arranged in groups in a plurality of mirror modules. The mirror modules each have a rectangular module border. The mirror modules are arranged in module columns, with at least some of the module columns being displaced with respect to one another along a column boundary line in such a way that at least some of the mirror modules adjacent to one another over the boundary line are arranged displaced with respect to one another so that their module border sides running transversely to the boundary line are not aligned flush with one another. The module columns are displaced with respect to one another along the column boundary line in such a way that, firstly, the micromirror array can reflect a specified overall illumination light beam, with, secondly, a protrusion of sections of the mirror modules not used for reflecting illumination light not being undesirably large so as to enable small reflection folding angles.

In an aspect, the disclosure provides a micromirror array for an illumination-optical component of a projection exposure apparatus for projection lithography, comprising a multiplicity of micromirrors, which are arranged in groups in a plurality of mirror modules. The mirror modules each have a rectangular module border. The mirror modules are arranged in module columns, with at least some of the module columns being displaced with respect to one another along a column boundary line in such a way that at least some of the mirror modules adjacent to one another over the boundary line are arranged displaced with respect to one another so that their module border sides running transversely to the boundary line are not aligned flush with one another. The displacement of the module columns displaced with respect to one another along the column boundary line is less than half the extent of the respective mirror module along the column boundary line.

According to the disclosure, it was recognized that potentially conflicting desired properties, such as, on the one hand, the moving away from allowing boundary lines between mirror modules to run parallel to an object displacement direction, as was recognized in WO 2015/028 451 A1 and WO 2013/167 409 A1, and, on the other hand, a standardized production of a micromirror array desired on account of the production costs, can be reconciled with one another in such a way that, nevertheless, only an advantageously small protrusion between sections of the mirror module not used for reflection and a boundary of the micromirror array can be realized.

To this end, in some embodiments, the module columns, in which the mirror modules are arranged, can be displaced with respect to one another in such a way that, firstly, the micromirror array can reflect a specified overall illumination light beam, with, secondly, despite a regularly required tilt of the mirror modules with respect to an object displacement direction, a protrusion of sections of unused mirror modules not being undesirably large so as to enable small reflection folding angles. For example, this makes it possible to use the micromirror array as a constituent part of an illumination-optical component, which is used as the last component upstream of a reflective object to be illuminated, with the result that due to the small protrusion of the sections of the mirror modules not used for reflection, a small reflection folding angle at the object, that is to say an angle of incidence of illumination light close to a perpendicular incidence at the object, is realizable. Such a small reflection folding angle enables, for example, a small angle of incidence of the illumination light on the reflective object, for example in the range of 2° to 8°.

In some embodiments, a displacement of the module columns along the boundary line can be less than half an extent of the respective mirror module along the boundary line and can be, for example, less than 50%, less than 40%, less than 30%, less than 20%, or even less than 10% than the mirror module extent along the boundary line. The displacement is regularly greater than 1% of the extent of the respective mirror module along the boundary line.

In these configurations of the micromirror array, some or all of the mutually adjacent module columns of the micromirror array can be displaced with respect to one another. For example, this also makes it possible to use the micromirror array as a constituent part of an illumination-optical component, which is used as the last component upstream of a reflective object to be illuminated, with a smallest possible reflection folding angle at the object, that is to say an angle of incidence of illumination light close to a perpendicular incidence, being realizable. Such a small angle of incidence, which may be in the range between 2° and 8°, for example, has proven to be advantageous for example for illuminating mask structures of lithography masks used in projection lithography.

The mirror modules of the micromirror array can have square borders. Alternatively or additionally, the micromirror array can also be equipped with rectangular mirror modules that do not have a square border. An arrangement of the mirror modules in which the module columns are displaced with respect to one another can be implemented in a non-Cartesian grid.

In general, the module columns each have a plurality of mirror modules. Individual module columns can also have exactly one mirror module. Depending on the embodiment, all module columns may also have a plurality of mirror modules. The number of mirror modules per module column can be in the range between 1 and 100, in the range between 1 and 75, in the range between 1 and 65, and for example in the range between 2 and 50.

In an aspect, the disclosure provides a micromirror array for an illumination-optical component of a projection exposure apparatus for projection lithography, comprising
  a multiplicity of micromirrors, which are arranged in groups in a plurality of mirror modules,
  wherein the mirror modules each have a rectangular module border,
  wherein the mirror modules are arranged in module columns, with at least some of the module columns being displaced with respect to one another along a column boundary line in such a way that at least some of the mirror modules adjacent to one another over the boundary line are arranged displaced with respect to one another so that their module border sides running transversely to the boundary line are not aligned flush with one another,
  wherein the micromirror array is arranged on a carrier,
  wherein the carrier has a near border side, which is closest to an arrangement region of the mirror modules of the micromirror array on the carrier, with at least one of the boundary lines between the module columns including a smallest angle of less than 45° with a normal of a carrier border direction of the near border side.

This design of the micromirror array can be combined with features of the other designs of the micromirror arrays discussed above.

The micromirror array can be part of an illumination-optical component, for example part of a facet mirror. In the beam path from the illumination light, the illumination-optical component can be the last component upstream of an object to be illuminated.

The illumination-optical component can be part of an optical assembly, which includes an object holder for holding a lithography mask in an object field, with the object holder being displaceable along a displacement direction by way of an object displacement drive. At least one of the boundary lines between the module columns of the micromirror array can include a smallest angle ranging between 0° and 90°, for example of less than 45°, with the displacement direction.

The illumination-optical component or the optical assembly can be part of an illumination optical unit for transferring the illumination light into an object field in which an object to be imaged is arrangeable. The illumination optical unit can be part of an optical system, which additionally includes a projection optical unit for imaging the object field into an image field, in which a wafer is arrangeable.

A partition can be arranged between the illumination optical unit and the projection optical unit, the partition being used for example for the thermal separation of the components of the illumination optical unit and the components of the projection optical unit. The angular relationship between the boundary lines and the module columns of the micromirror array and the normal of the carrier border direction of the near border side can lead to a relatively small reflection folding angle being realizable on the object, for example when the micromirror array is the last optical component in the beam path of illumination or imaging light upstream of an object to be illuminated. An angle of incidence of the illumination light guided by the micromirror array at the object can be close to the perpendicular incidence in the range of between 2° and 8°, for example.

The illumination system can include a light source for the illumination light.

The illumination system can be part of a projection exposure apparatus, which also comprises a wafer holder for holding the wafer.

A micromirror can be arranged on a carrier, wherein the carrier has a near border side which is closest to an arrangement region of the mirror modules of the micromirror array on the carrier, with at least one of the boundary lines between the module columns including a smallest angle ranging between 0° and 90° with a normal of a carrier border direction of the near border side. Tilting of the boundary lines to the near border side makes it possible to arrange the boundary lines in tilted fashion with respect to an object displacement direction of an object to be imaged during operation of the projection exposure apparatus. This smallest angle, which is included by the boundary lines between the module columns and a normal of a carrier border direction of the near border side, can be unequal to 45°, can be less than 45°, and can be 37° or 25°, for example. As a result, the boundary lines between the mirror modules do not run parallel to an object displacement direction as soon as such a micromirror array has been mounted.

This can yield benefits of the illumination, for example the scan-integrated averaging effects, which have already been discussed in WO 2013/167 409 A1, for example.

The mirror modules can be arranged in a periodic, non-Cartesian grid. Such an arrangement of the mirror modules can additionally simplify the production of the micromirror array. Alternatively, the arrangement of the mirror modules may also be non-periodic.

An illumination-optical component can comprise a micromirror array as according to the disclosure. Features of such an illumination-optical can correspond to those which were explained above with reference to the micromirror array.

An optical assembly can comprise an illumination-optical component as described in the preceding paragraph and an object holder for holding a lithography mask in an object field. The object holder can be displaceable along a displacement direction via an object displacement drive. At least one of the boundary lines between the module columns can include a smallest angle ranging between 0° and 90° with a displacement direction. Such an optical assembly can have features corresponding to those which were already explained above. The smallest angle between at least one of the boundary lines and the object displacement direction can be unequal to 45°, can be less than 45°, and can be 370 or 25°, for example.

An illumination optical unit can comprise an illumination-optical component as described above or an optical assembly as described above for transferring illumination light into an object field in which an object to be imaged is arrangeable. Such an illumination optical unit can have features corresponding to those explained above in the context of the micromirror array or the optical assembly. The micromirror array can be a second faceted element of a specular reflector of the illumination optical unit or can represent a pupil facet mirror of the illumination optical unit.

An optical system can comprise an illumination optical unit according to the disclosure and a projection optical unit for imaging the object field into an image field in which a wafer is arrangeable. An illumination system can comprise an illumination optical unit according to the disclosure and a light source for the illumination light. A projection exposure apparatus for projection lithograph can comprise such an illumination system, an object holder for holding a lithography mask, and a wafer holder for holding a wafer. A method for producing a microstructured or nanostructured component, can comprise the following method steps: providing a wafer, to which a layer made of a light-sensitive material is at least partly applied; providing a reticle which has structures to be imaged; providing a projection exposure apparatus according to the disclosure; and projecting at least one part of the reticle onto a region of the layer with the aid of a projection optical unit of the projection exposure apparatus. A component can be produced by such a method. Features of such an optical system, such an illumination system, such a projection exposure apparatus, such a production method, and such a microstructured or nanostructured component can correspond to those which have already been explained above with reference to the illumination optical unit. By way of example, it is possible to produce a semiconductor chip with an extremely high integration density, for example with a very high storage density.

BRIEF DESCRIPTION OF THE DRAWINGS

Below, exemplary embodiments of the disclosure is described on the basis of the drawings, in which.

DETAILED DESCRIPTION

Figure 1:
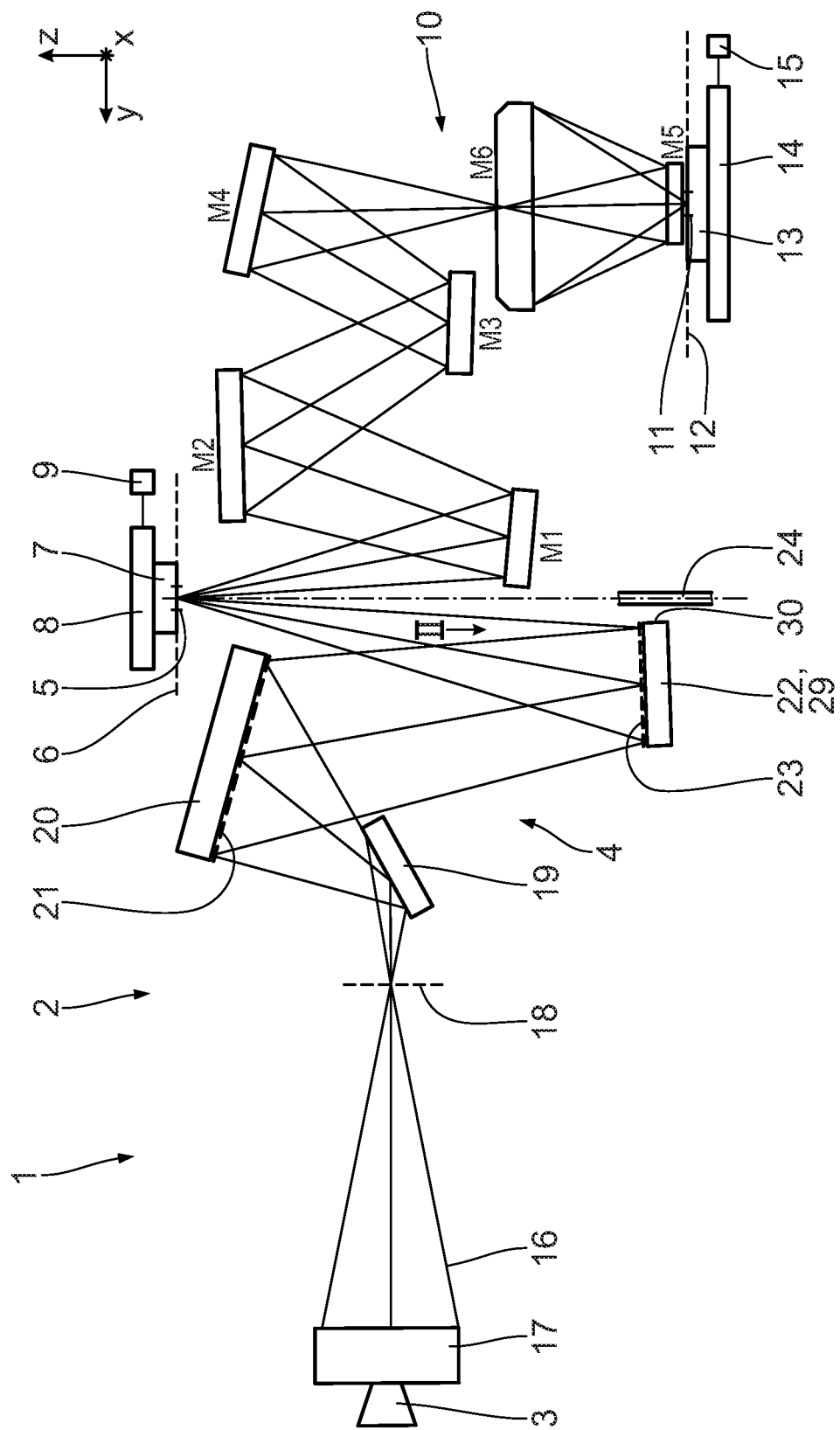
FIG. 1 schematically shows a meridional section of a projection exposure apparatus for EUV projection lithography.

Parts of a microlithographic projection exposure apparatus 1 are described in exemplary fashion below initially with reference to FIG. 1. The description of the basic structure of the projection exposure apparatus 1 and its components should not be construed as limiting here.

An embodiment of an illumination system 2 of the projection exposure apparatus 1 has, in addition to a radiation source or a light source 3, an illumination optical unit 4 for illuminating an object field 5 in an object plane 6. In an alternative embodiment, the light source 3 can also be provided as a module separate from the rest of the illumination system. In this case, the illumination system does not comprise the light source 3.

A reticle 7 arranged in the object field 5 is exposed. The reticle 7 is held by a reticle holder 8. The reticle holder 8 is displaceable by way of a reticle displacement drive 9, for example in a scanning direction.

A Cartesian xyz-coordinate system is plotted in FIG. 1, and also in the subsequent figures, for explanation purposes. The x direction runs perpendicularly to the plane of the drawing. The y direction runs horizontally, and the z direction runs vertically. The scanning direction runs in the y-direction in FIG. 1. The z-direction runs perpendicular to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6.

Alternatively, an angle that differs from 0° is also possible between the object plane 6 and the image plane 12.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, for example in the y-direction. The displacement, firstly, of the reticle 7 by way of the reticle displacement drive 9 and, secondly, of the wafer 13 by way of the wafer displacement drive 15 can be implemented so as to be synchronized with one another.

The radiation source 3 is an EUV radiation source. The radiation source 3 emits, for example, EUV radiation 16, which is also referred to below as used radiation, illumination radiation or illumination light. For example, the used radiation has a wavelength in the range of between 5 nm and 30 nm. The radiation source 3 can be a plasma source, for example an LPP (laser produced plasma) source or a GDPP (gas discharge produced plasma) source. It may also be a synchrotron-based radiation source. The radiation source 3 may be a free electron laser (FEL).

The illumination radiation 16 emerging from the radiation source 3 is focused by a collector 17. The collector 17 may be a collector with one or more ellipsoidal and/or hyperboloidal reflection surfaces. The illumination radiation 16 can be incident on the at least one reflection surface of the collector 17 with grazing incidence (GI), that is to say at angles of incidence of greater than 45°, or with normal incidence (NI), that is to say at angles of incidence of less than 45°. The collector 17 may be structured and/or coated on the one hand for optimizing its reflectivity for the used radiation and on the other hand for suppressing extraneous light.

Downstream of the collector 17, the illumination radiation 16 propagates through an intermediate focus in an intermediate focal plane 18. The intermediate focal plane 18 can represent a separation between a radiation source module, having the radiation source 3 and the collector 17, and the illumination optical unit 4.

The illumination optical unit 4 comprises a deflection mirror 19 and, arranged downstream thereof in the beam path, a first facet mirror 20. The deflection mirror 19 may be a plane deflection mirror or, alternatively, a mirror with a beam-influencing effect that goes beyond the purely deflecting effect. Alternatively or in addition, the deflection mirror 19 may be in the form of a spectral filter that separates a used light wavelength of the illumination radiation 16 from extraneous light of a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which are also referred to below as field facets. FIG. 1 depicts only some of the facets 21 by way of example.

The first facets 21 can be in the form of macroscopic facets, for example in the form of rectangular facets or in the form of facets with an arcuate peripheral contour or a peripheral contour of part of a circle. The first facets 21 can be embodied as plane facets or, alternatively, as convexly or concavely curved facets.

As known for example from DE 10 2008 009 600 A1, the first facets 21 themselves may also be composed in each case of a multiplicity of individual mirrors, for example a multiplicity of micromirrors. The first facet mirror 20 may for example be formed as a microelectromechanical system (MEMS system). For details, reference is made to DE 10 2008 009 600 A1.

The illumination radiation 16 travels horizontally, that is to say in the y-direction, between the collector 17 and the deflection mirror 19.

In the beam path of the illumination optical unit 4, a second facet mirror 22 is arranged downstream of the first facet mirror 20. The second facet mirror 22 may be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978. Provided the second facet mirror 22 is alternatively arranged in a pupil plane of the illumination optical unit 4, it is also referred to as a pupil facet mirror.

The second facet mirror 22 comprises a plurality of second facets 23. The second facets 23 are mirror modules 23b assembled from micromirrors 23a (cf. FIG. 2), with each mirror module having a rectangular module boundary 23c, specifically a square module boundary in this case.

The arrangement of the mirror modules 23b of the second facet mirror 22 results in a micromirror array 23d. The mirror modules 23b and the arrangement thereof are explained in more detail below. In respect of an embodiment of the second facets 23 as micromirrors, reference is likewise made to DE 10 2008 009 600 A1. In the case of a pupil facet mirror, the second facets 23 or groups of these second facets are also referred to as pupil facets.

The second facets 23 can have plane or, alternatively, convexly or concavely curved reflection surfaces.

The illumination optical unit 4 consequently forms a doubly faceted system. This fundamental principle is also referred to as a fly's eye condenser (fly's eye integrator).

In the embodiment as a pupil facet mirror, it may be advantageous to arrange the second facet mirror 22 not exactly in a plane that is optically conjugate to a pupil plane of the projection optical unit 7. For example, the pupil facet mirror 22 can be arranged so as to be tilted relative to a pupil plane of the projection optical unit 7, as is described, for example, in DE 10 2017 220 586 A1.

With the aid of the second facet mirror 22, the individual first facets 21 are imaged into the object field 5 in the embodiment as a pupil facet mirror.

The second facet mirror 22 is the last beam-shaping mirror or actually the last mirror for the illumination radiation 16 in the beam path upstream of the object field 5.

In a further embodiment, not shown, of the illumination optical unit 4, a transfer optical unit contributing for example to the imaging of the first facets 21 into the object field 5 may be arranged in the beam path between the second facet mirror 22 and the object field 5. The transfer optical unit may have exactly one mirror, or alternatively have two or more mirrors, which are arranged one behind the other in the beam path of the illumination optical unit 4. The transfer optical unit may for example comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the first facet mirror 20, and the second facet mirror 22.

In a further embodiment of the illumination optical unit 4, there is also no need for the deflection mirror 19, and so the illumination optical unit 4 may then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is often only approximate imaging.

The projection optical unit 10 comprises a plurality of mirrors Mi, which are consecutively numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve or any other number of mirrors Mi are likewise possible. The projection optical unit 10 is a twice-obscured optical unit. The penultimate mirror M5 and the last mirror M6 each have a passage opening for the illumination radiation 16. The projection optical unit 10 has an image-side numerical aperture that is greater than 0.5 and may also be greater than 0.6, and may be for example 0.7 or 0.75.

Reflection surfaces of the mirrors Mi may be embodied as free-form surfaces without an axis of rotational symmetry. Alternatively, the reflection surfaces of the mirrors Mi may be designed as aspheric surfaces with exactly one axis of rotational symmetry of the reflection surface shape. Just like the mirrors of the illumination optical unit 4, the mirrors Mi may have highly reflective coatings for the illumination radiation 16. These coatings may be designed as multilayer coatings, for example with alternating layers of molybdenum and silicon.

The projection optical unit 10 has a large object-image offset in the y-direction between a y-coordinate of a center of the object field 5 and a y-coordinate of the center of the image field 11. This object-image offset in the y-direction can be of approximately the same magnitude as a z-distance between the object plane 6 and the image plane 12.

For example, the projection optical unit 10 can have an anamorphic embodiment. For example, it has different imaging scales $\beta_x$, $\beta_y$ in the x- and y-directions. The two imaging scales $\beta_x$, $\beta_y$ of the projection optical unit 10 are preferably at $(\beta_x, \beta_y) = (+/-0.25, /+-0.125)$. A positive imaging scale R means imaging without image inversion. A negative sign for the imaging scale R means imaging with image inversion.

The projection optical unit 7 consequently leads to a reduction in size with a ratio of 4:1 in the x-direction, that is to say in a direction perpendicular to the scanning direction.

The projection optical unit 10 leads to a reduction in size of 8:1 in the y-direction, that is to say in the scanning direction.

Other imaging scales are likewise possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 5 and the image field 11 can be the same or, depending on the embodiment of the projection optical unit 10, can differ. Examples of projection optical units with different numbers of such intermediate images in the x- and y-directions are known from US 2018/0074303 A1.

In each case one group of the micromirrors 23a of the second facets 23 is assigned to exactly one of the first facets 21 for respectively forming an illumination channel for illuminating the object field 5. This may for example produce illumination according to the Kohler principle. The entire beam of the illumination radiation 16 is decomposed into a multiplicity of object fields or object field sections 5 with the aid of the first facets 21.

In the embodiment of the illumination optical unit 4 with a field facet mirror 20 and a pupil facet mirror 22, the first facets 21 generate a plurality of images of the intermediate focus on the pupil facets 23 respectively assigned thereto. Here, the field facets 21 are imaged, in each case by way of an assigned pupil facet 23, onto the reticle 7 in a manner such that they are overlaid on one another for the purposes of illuminating the object field 5.

The illumination of the object field 5 is for example as homogeneous as possible. It preferably has a uniformity error of less than 2%. The field uniformity may be achieved by way of the overlay of different illumination channels.

The illumination of the entrance pupil of the projection optical unit 10 may be defined geometrically by an arrangement of the second facets. The intensity distribution in the entrance pupil of the projection optical unit 10 may be set by selecting the illumination channels, for example the subset of the second facets, which guide light. This intensity distribution is also referred to as illumination setting or as illumination pupil filling.

A likewise preferred pupil uniformity in the region of sections of an illumination pupil of the illumination optical unit 4 which are illuminated in a defined manner may be achieved by a redistribution of the illumination channels.

Further aspects and details of the illumination of the object field 5 and for example of the entrance pupil of the projection optical unit 10 are described below.

The projection optical unit 10 may have for example a homocentric entrance pupil. The latter may be accessible. It may also be inaccessible.

It may be the case that the projection optical unit 10 has different poses of the entrance pupil for the tangential beam path and for the sagittal beam path. In this case, an imaging element, for example an optical component part of the transfer optical unit, should be provided between the second facet mirror 22 and the reticle 7. With the aid of this optical element, the different poses of the tangential entrance pupil and the sagittal entrance pupil may be taken into account.

In the arrangement of the components of the illumination optical unit 4 shown in FIG. 1, the second facet mirror 22 is arranged in an area conjugate to the entrance pupil of the projection optical unit 10. The first facet mirror 20 is arranged so as to be tilted in relation to the object plane 5. The first facet mirror 20 is arranged so as to be tilted in relation to an arrangement plane defined by the deflection mirror 19.

The first facet mirror 20 is arranged so as to be tilted with respect to an arrangement plane defined by the second facet mirror 22.

A partition 24 shown in sections in FIG. 1 is arranged between the illumination optical unit 4 and the projection optical unit 10, the partition extending in the xz-plane and serving for a thermal separation of the components of the illumination optical unit 4 from the components of the projection optical unit 10.

Figure 2:
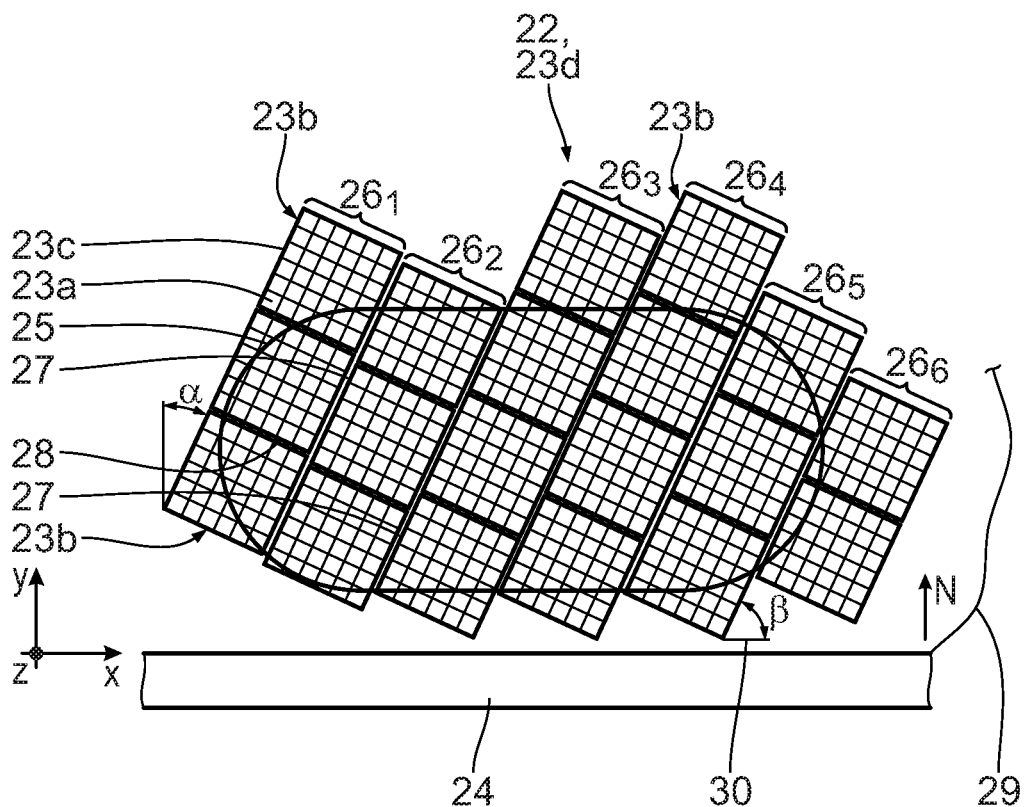
FIG. 2 shows a plan view of mirror modules of a second faceted mirror or second facet mirror of an illumination optical unit of the projection exposure apparatus according to FIG. 1, as seen from viewing direction II in FIG. 1, with a partition between illumination-optical and projection-optical components of the projection exposure apparatus also being shown and with an edge contour of an envelope of an entire beam of illumination light reflected by micromirrors of the mirrors of the second facetted element moreover being plotted, the second facetted mirror being embodied as a specular reflector.

FIG. 2 shows a plan view of an arrangement of the mirror modules 23b of the second facet mirror 22. In addition, the partition 24 adjacent to this mirror module arrangement is shown, the partition being only very slightly spaced apart from the mirror modules 23b in the y-direction. FIG. 2 et seq. show an exemplary number of mirror modules 23b to clarify details of their positional relationship. In the case of a second facet mirror used in practice, of the type of the second facet mirror 22, the number of mirror modules 23b can be very much larger.

Further, FIG. 2 depicts an edge contour 25 of an envelope of an entire beam of the illumination light 16 on the second facet mirror 22. The mirror modules 23b are arranged in such a way that the entire interior of this edge contour 25 is covered by the micromirrors 23a.

In the embodiment of the illumination optical unit 4 as a specular reflector, the edge contour 25 emerges as a convolution of a border shape of the object field 5 with a border shape of the illumination pupil of the illumination optical unit 4. In the example according to FIG. 2, the object field 5 has a rectangular border and the illumination pupil has a round border, so that a stadium shape of the edge contour 25 emerges as a convolution. This edge contour 25 is also referred to as the footprint of the illumination light 16 on the second facet mirror 22.

In the mirror modules 23b, the micromirrors 23a are combined in groups of thirty-six micromirrors 23a each. Each mirror module 23b is constructed as a 6×6 grid of the square micromirrors 23a. Depending on the embodiment of the mirror module 23b, the latter can have a number of micromirrors 23a ranging between ten and several hundred. By way of example, the number of micromirrors 23a per mirror module 23b may range between 100 and 1000, for example between 400 and 900. Like in the embodiments of the second facet mirror according to FIG. 2 et seq., the mirror module 23b can have a square border, but can also be designed with a rectangular border, for example.

In the embodiment depicted in FIG. 2, the mirror modules 23b are arranged in a total of six module columns $26_1$, $26_2$, $26_3$, $26_4$, $26_5$, and $26_6$. Column boundary lines 27 which run parallel to one another are located between mutually adjacent module columns $26_i$, $26_{i+1}$ of this type. An angle α between the boundary lines 27 and the y-axis, that is to say an object displacement direction of the projection exposure apparatus 1, is 25° in the embodiment according to FIG. 2. This angle α can also have a different value in the range between 0° and 90°, for example 10°, 37°, or 65°. The angle α is regularly not equal to 45°. The smallest angle that the column boundary lines 27 includes with the y-axis then is less than 45° and can be less than 30°, for example 25°. This angle is regularly greater than 10, greater than 5°, or else greater than 10°.

Depending on the embodiment of the second facet mirror 22, the number of module columns $26_i$ can be in the range of between three and one hundred, for example between 25 and 65.

The second facet mirror 22 has a total of nineteen mirror modules 23b.

The adjacent module columns $26_i$, $26_{i+1}$ are displaced with respect to one another along the boundary line 27 therebetween, in such a way that the mirror modules of the module columns $26_i$, $26_{i+1}$ adjacent to one another over this boundary line 27 are arranged displaced with respect to one another. In the illustrated embodiment, this displacement is such that module border sides 28 running transversely to the boundary line 27 therebetween are not aligned flush with one another.

In the mirror module arrangement according to FIG. 2, a displacement between the two module columns $26_1$ and $26_2$ arranged on the left is small and is less than one edge length of a micromirror 23a. The two module columns $26_2$, $26_3$ are displaced with respect to one another by about one micromirror edge length. In relation to one another, the module columns $26_3$ and $26_4$ are displaced with respect to one another by about 2.5 micromirror edge lengths. The module columns $26_4$ and $26_5$ are displaced with respect to one another by about three micromirror edge lengths. In turn, the module columns $26_5$ and $26_6$ are displaced with respect to one another by about 2.5 micromirror edge lengths. Along the respective boundary line 27, this displacement can be less than 50%, less than 40%, less than 30%, less than 20%, or even less than 10% of the extent of the mirror module 23b along the boundary line 27, independently of the number of micromirrors along the micromirror edge length of a mirror module 23b. This displacement is regularly greater than 1% of the extent of the respective mirror module 23b along the boundary line 27.

Overall, practically all adjacent module columns $26_i$, $26_{i+1}$ in the mirror module arrangement according to FIG. 2 are displaced with respect to one another by individual path lengths, resulting in a non-periodic grid of the mirror modules 23b.

The arrangement of the mirror modules 23b is an arrangement in a non-Cartesian grid due to the displacement of the module columns $26_i$ relative to one another.

The micromirror array 23d is arranged on a carrier 29, the border of which is merely indicated fractionally in FIG. 2. The carrier 29 has a near border side 30. In comparison to other border sides of the carrier 29, this is closest to the mirror modules 23b of the micromirror array 23d on the carrier 29, for example in the plan view according to FIG. 2. All other border sides of the carrier 29 are therefore at a greater distance from the arrangement of the mirror modules 23b than the near border side 30. The boundary lines 27 or at least one of these boundary lines 27 between the module columns $26_i$, $26_{i+1}$ includes a smallest angle R ranging between 0° and 90°, for example therefore less than 90°, with a carrier border direction x of the near border side 30. In the case of the arrangement according to FIG. 2, β is 90°−α and is therefore 65°. A normal N to the border direction 30 in turn includes the angle α with the at least one boundary line 27.

The displacements of the module columns $26_i$ with respect to one another other is such that, firstly, the entire edge contour 32 is covered by as few mirror modules 23b as possible, with, secondly, a protrusion of unused sections of the mirror modules 23b beyond the edge contour 32 in the direction of the partition 24 being as small as possible.

Figure 3:
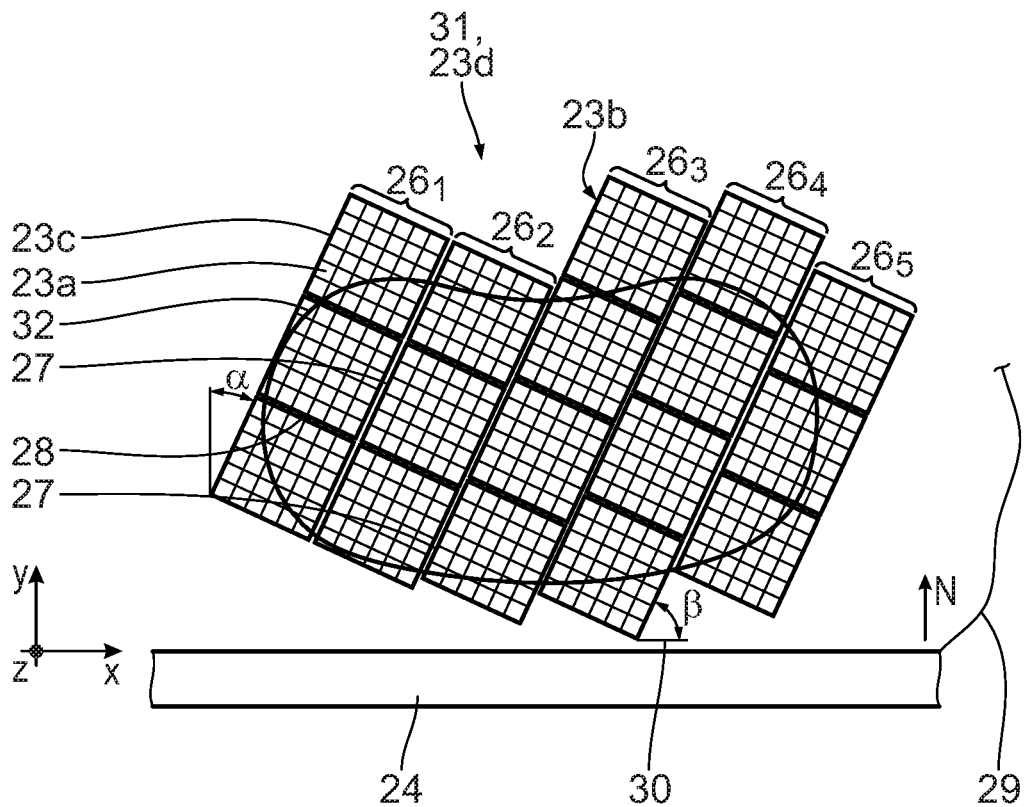
FIG. 3 shows, in a representation similar to FIG. 2, a further embodiment of a mirror module arrangement of the second faceted mirror.

FIG. 3 shows a further embodiment of a second facet mirror 31, which can be used instead of the second facet mirror 22 according to FIG. 2 in a variant of the illumination optical unit 4 of the projection exposure apparatus 1 according to FIG. 1. Components and functions corresponding to those which have already been explained above with reference to FIGS. 1 and 2 have the same reference signs and will not be discussed in detail again.

In the case of the second facet mirror 31, a module column arrangement of the mirror modules 23b is such that an edge contour 32 of an entire beam of the illumination light 16, which is shaped differently in comparison to the illumination according to FIG. 2, is reflected in full by the micromirrors 23a of the mirror modules 23b for guiding the illumination light 16 in the illumination optical unit 4.

The second facet mirror 31 is used instead of the second facet mirror 22 in an embodiment of the illumination optical unit 4 of the projection exposure apparatus 1 in which an arcuate object field 5 is illuminated instead of a rectangular object field. A convolution of this arcuate object field 5 with the round pupil of the illumination optical unit 4 leads to an approximately kidney-shaped or bean-shaped edge contour 32. In the embodiment of the illumination optical unit 4 for which the second facet mirror 31 can be used, the edge contour 32 is curved away from the partition 24 so that a convex longitudinal side of the edge contour 32 faces the partition 24.

The second facet mirror 31 has a total of five module columns $26_1$ to $26_5$. The two module columns $26_1$ and $26_2$ shown on the far left in FIG. 3 are not displaced with respect to one another along the column boundary line 27 therebetween, with the result that their module border sides 28, which run transversely to the boundary line 27, are aligned flush with one another. The other module columns $26_3$, $26_4$, and $26_5$ are displaced with respect to one another and relative to the module column $26_2$ along the respective boundary lines 27 therebetween, as has already been explained above in connection with the second facet mirror 22 in FIG. 2. Since an x-extent of the kidney-shaped edge contour 32 is somewhat smaller than the x-extent of the radial edge contour 25, the result is one module column $26_i$ fewer being required in the case of the second facet mirror 31 according to FIG. 3 vis-à-vis the case of the second facet mirror 22.

Figure 4:
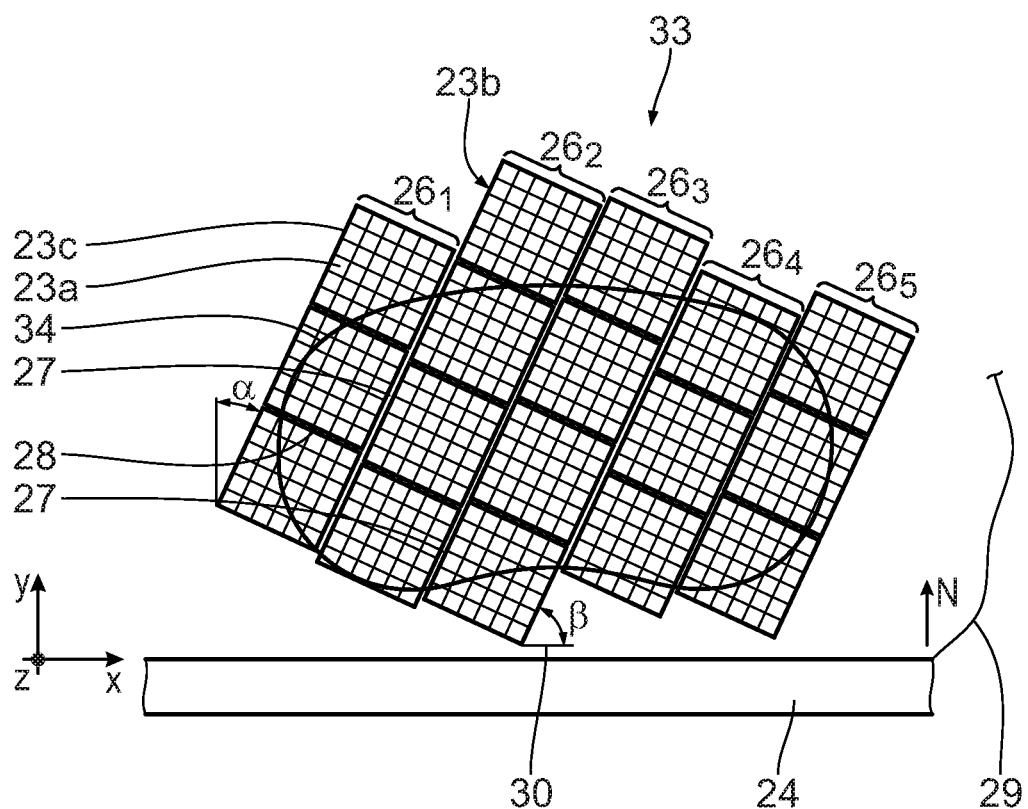
FIG. 4 shows, in a representation similar to FIG. 2, a further embodiment of a mirror module arrangement of the second faceted mirror.

FIG. 4 shows a further embodiment of a second facet mirror 33, which in turn can be used instead of the second facet mirror 22 or 31 in a further embodiment of the illumination optical unit 4. Components and functions corresponding to those which have already been explained above with reference to FIGS. 1 to 3 bear the same reference signs and will not be discussed in detail again.

The illumination optical unit 4, in which the second facet mirror 33 is used, is in turn embodied to illuminate an arcuate object field 5. The design of firstly the illumination optical unit 4 and secondly the subsequent projection optical unit 10 is such that an edge contour 34 of an entire beam of the illumination light 16 once again arises in kidney-shaped or bean-shaped fashion as a convolution with the round illumination pupil, with a curvature of the edge contour 34 in this case being toward the partition 24 so that a concave longitudinal contour section faces the partition 24 in the case of the edge contour 34.

The second facet mirror 33 has five module columns $26_1$ to $26_5$. In the second facet mirror 33, the adjacent module columns $26_i$, $26_{i+1}$ are in turn displaced with respect to one another along the respective column boundary lines 27 therebetween, in such a way that the edge contour 34 is occupied as efficiently as possible by the mirror modules 23b, with a constraint being that a smallest possible protrusion of unused sections of the mirror modules 23b beyond the edge contour 34 is present in the direction of the partition 24. Like the second facet mirror 31 according to FIG. 3, the second facet mirror 33 has a total of seventeen mirror modules 23b.

In the facet mirror 33, all module columns $26_i$ are in turn displaced with respect to one another in pairs, in such a way that the module border sides 28 running transversely to the column boundary lines 27 are not aligned flush with one another.

Figure 5:
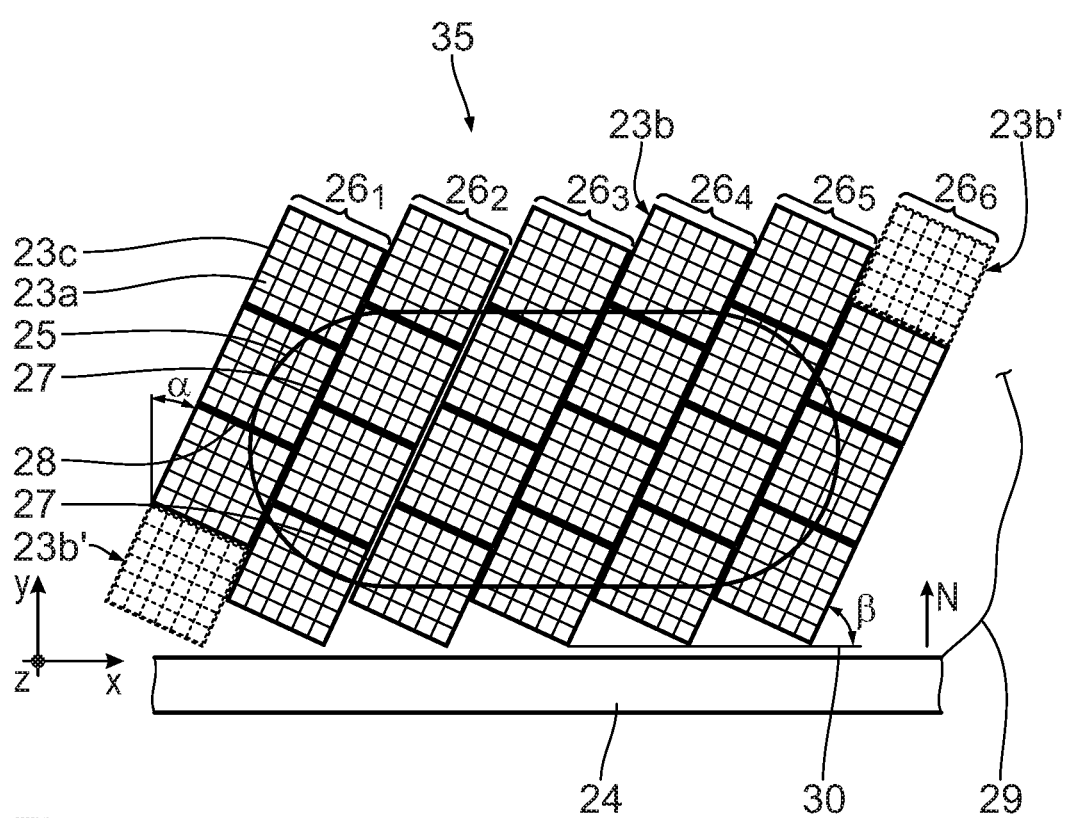
FIG. 5 shows, in a representation similar to FIG. 2, a further embodiment of a mirror module arrangement of the second faceted mirror.

FIG. 5 shows a further embodiment of a second facet mirror 35, which can be used instead of the second facet mirror 22 according to FIG. 2. Components and functions corresponding to those which have already been explained above with reference to FIGS. 1 to 4 bear the same reference signs and will not be discussed in detail again.

In the case of the second facet mirror 35, the mirror modules 23b are arranged in a periodic grid. The module columns 23b can thus be transferred into one another by translation in the x-direction. Firstly due to the tilting of the module columns $26_i$ with respect to the Cartesian coordinates xy and once again due to the displacement of adjacent module columns $26_i$, $26_{i+1}$ along the column boundary lines 27 therebetween, in such a way that the module border sides 28 running transversely to the respective boundary lines 27 are not aligned with one another, this results in an arrangement of the mirror modules 23b in a non-Cartesian grid.

Shown in solid lines in FIG. 5 are those mirror modules 23b which are required, at least in part, for reflecting the entire beam of illumination light 16 with the stadium-shaped edge contour 25. Two mirror modules 23b' respectively at the bottom left and at the top right of the module arrangement according to FIG. 5, which belong to the periodic module arrangement per se, are shown in dashed lines in FIG. 5 because they do not contribute to the reflection of the illumination light 16 and could therefore also be dispensed with.

This displacement is equal between all module columns $26_i$, $26_{i+1}$ and is approximately three edge lengths of the micromirrors 23a. The displacement is approximately half the edge length of a mirror module 23b.

The second facet mirror 35 has a total of twenty-two mirror modules 23b used for reflection.

Figure 6:
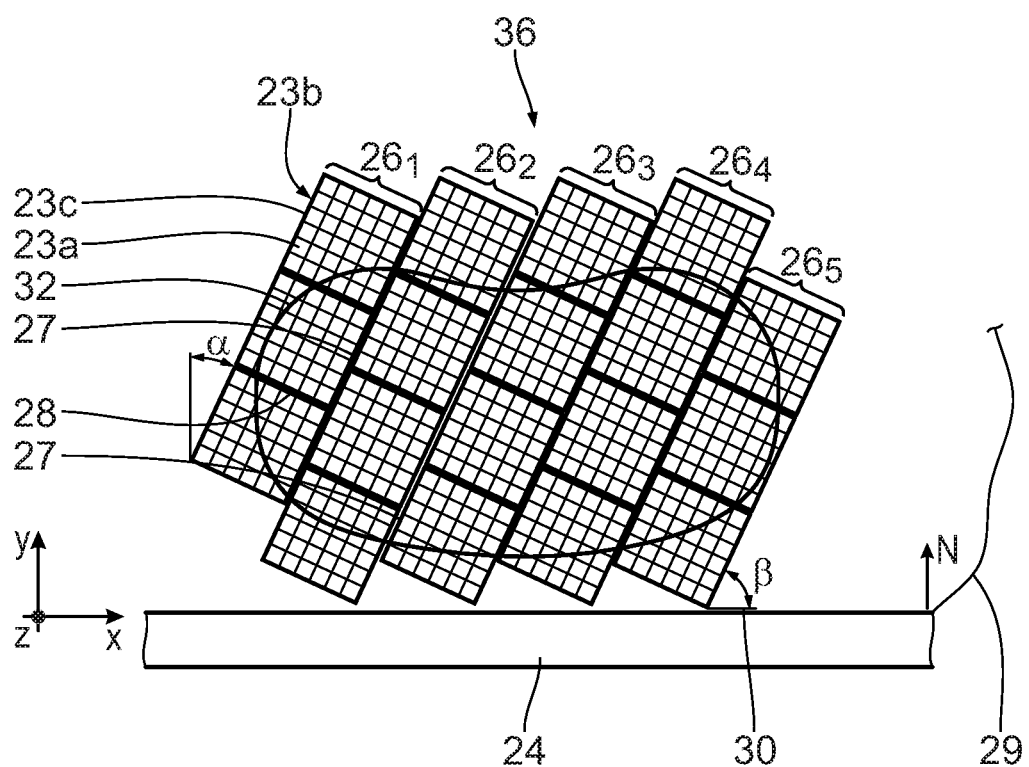
FIG. 6 shows the embodiment according to FIG. 5, when reflecting an alternative entire beam edge contour of the illumination light.

FIG. 6 shows a further embodiment of a second facet mirror 36, which embodiment can be used instead of the second facet mirror 31 according to FIG. 3. Components and functions corresponding to those which have already been explained above with reference to FIGS. 1 to 5 bear the same reference signs and will not be discussed in detail again.

In accordance with the second facet mirror 35 according to FIG. 5, the second facet mirror 36 is designed as a periodic, non-Cartesian grid of the mirror modules 23b. Then, a total of eighteen mirror modules 23b are required for the complete reflection of the edge contour 32. A maximum protrusion of unused sections of the mirror modules 23b beyond the edge contour 32 in the direction toward the partition 24 is as large in the case of the second facet mirror 36 as it is in the case of the second facet mirror 31.

Figure 7:
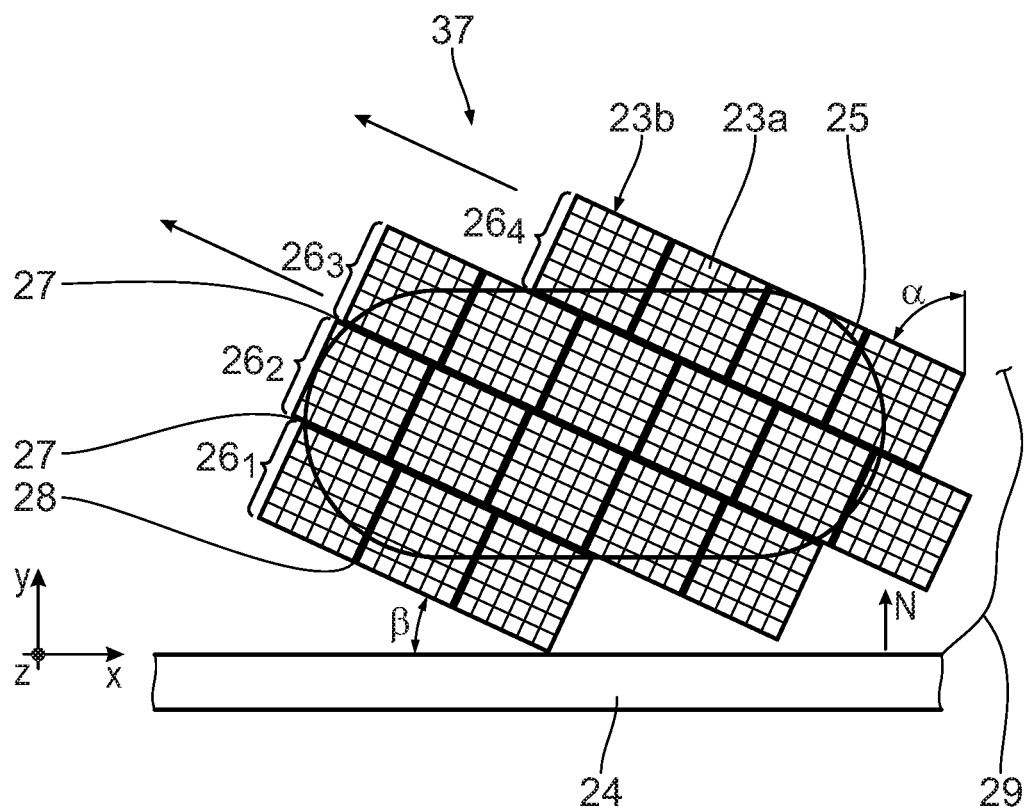
FIG. 7 shows, in a representation similar to FIG. 2, a further embodiment of a mirror module arrangement of the second faceted mirror.

FIG. 7 shows a further embodiment of a second facet mirror 37, which can be used, for example, instead of the second facet mirrors 22 according to FIGS. 2 and 35 according to FIG. 5, respectively. Components and functions corresponding to those which have already been explained above with reference to FIGS. 1 to 6 bear the same reference signs and will not be discussed in detail again.

In the case of the second facet mirror 37, the column boundary lines 27 run at an angle α of 65° with respect to the y-axis, that is to say with respect to the object displacement direction. Accordingly, the angle R between the column boundary lines 27 and the partition 24 or the near border side 30 closest thereto is 25°. One direction of the column boundary lines 27 is additionally emphasized by arrows in FIG. 7.

The angle α of 65° is also present between the normal N of the partition 24 or of the near border side 30 on the one hand and the column boundary lines 27 on the other hand.

The mirror module arrangement is once again not periodic in the case of the second facet mirror 37 and also non-Cartesian on account of the displacement of the module columns $26_i$, $26_{i+1}$ adjacent to one another along the boundary lines 27 therebetween.

Overall, the second facet mirror 37 has eighteen mirror modules 23b, which contribute at least sectionally to the reflection of the illumination light 16 within the edge contour 25.

A maximum protrusion of unused sections of the mirror modules 23b beyond the edge contour 25 in the direction toward the partition 24 is greater in the case of the second facet mirror 37 according to FIG. 7 than in the case of the second facet mirror 22 according to FIG. 2. In this respect, the second facet mirror 22 according to FIG. 2 is more advantageous than the second facet mirror 37 according to FIG. 7.

Figure 8:
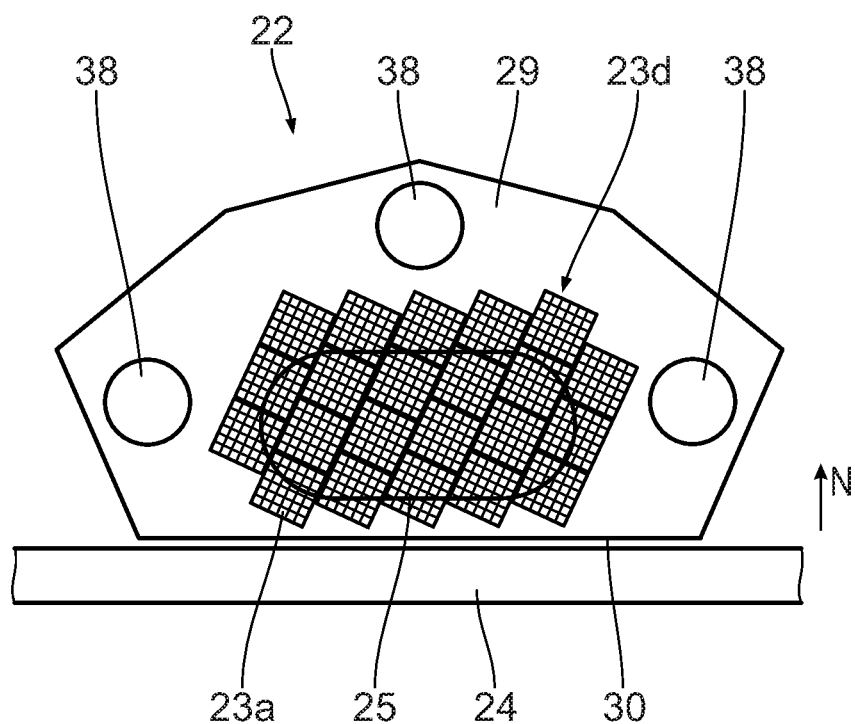
FIG. 8 shows the mirror module arrangement according to FIG. 5 together with a carrier component of the second faceted mirror for the mirror modules.

FIG. 8 shows the second facet mirror 22 according to FIG. 5, including the carrier 29 for holding the micromirror array 23d.

The carrier 29 is assembled on a frame (not shown in the drawing) of the illumination optical unit 4 via three retaining bushes 38. FIG. 8 also depicts the near border side 30 of the edge contour of the carrier 29. This near border side 30 runs parallel to the partition 24. As already explained above in connection with FIG. 2, the near border side 30 is that contour section of the entire edge contour of the carrier 29 which is closest to the mirror modules 23b of the micromirror array 23d of the second facet mirror 22.

Figure 9:
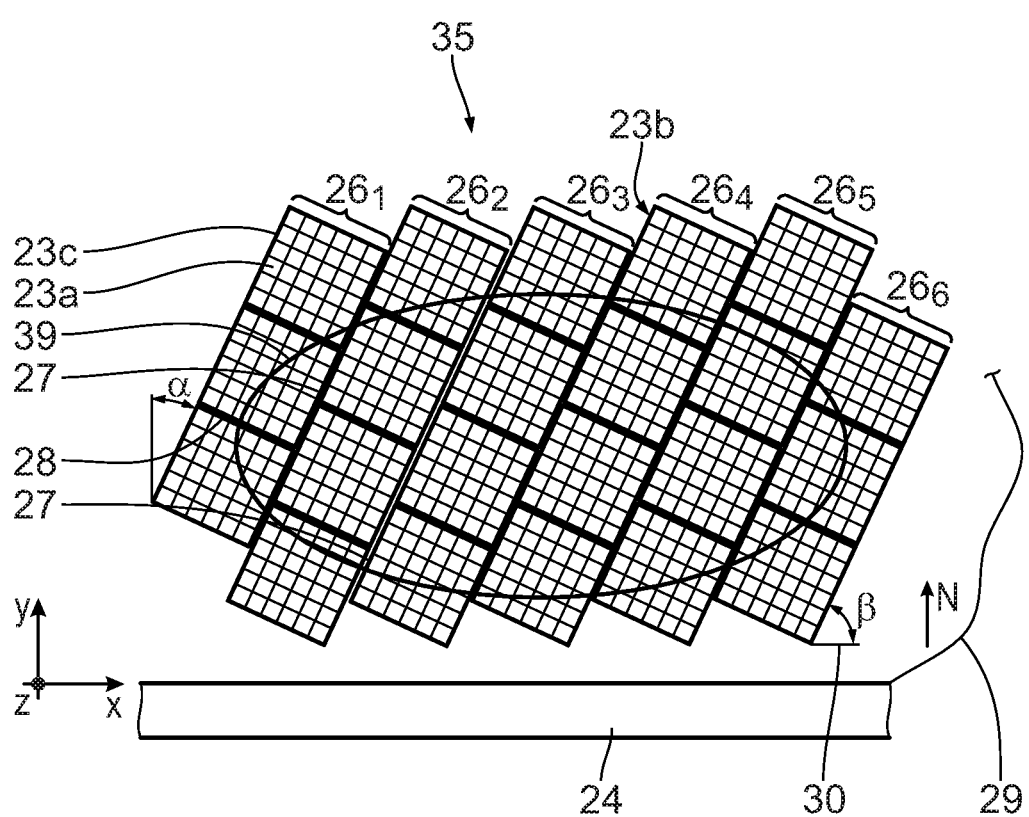
FIG. 9 shows the embodiment according to FIG. 5, when reflecting an alternative entire beam edge contour of the illumination light, with the second facetted mirror being designed as a pupil facet mirror.

FIG. 9 shows the second facet mirror 35 according to FIG. 5 when used as a pupil facet mirror in a corresponding illumination optical unit 4 of the projection exposure apparatus 1. In this embodiment, an edge contour 39 of the entire beam of illumination light 16 has the shape of a utilized pupil of the illumination optical unit 4 and is elliptical on the pupil facet mirror 35 in this embodiment of the illumination optical unit 4, which may emerge, for example, from an anamorphic design of the projection optical unit.

During the projection exposure, at least one part of the reticle 7 in the object field 5 is imaged, with the aid of the projection exposure apparatus 1, onto a region of the light-sensitive layer on the wafer 13 in the image field 11 for the lithographic production of a microstructured or nanostructured component, for example of a semiconductor component, for example of a microchip. Here, the reticle 7 and the wafer 13 can be displaced in a manner synchronized in time in the scanning direction y.

What is claimed is:

1. A micromirror array, comprising:
a multiplicity of micromirrors arranged in groups in a plurality of mirror modules,
wherein:
   each mirror module has a rectangular module border;
   the mirror modules are arranged in module columns;
   at least some of the module columns are displaced with respect to one another along a column boundary line;
   at least some of the mirror modules adjacent to one another over the boundary line are displaced with respect to one another so that their module border sides transverse to the boundary line are not flush with one another;
   the module columns are displaced with respect to one another along the column boundary line so that the micromirror array is configured to reflect a specified overall illumination light beam and so that a protrusion of sections of the mirror modules not used to reflect illumination light enable small reflection folding angles,
wherein a distance of a gap that is present between immediately neighboring micromirrors of different mirror modules is greater than a distance between immediately neighboring mirrors within a mirror module.

2. The micromirror array of claim 1, wherein:
the micromirror array is arrangeable on a carrier having a near border side closest to an arrangement region of the mirror modules of the micromirror array on the carrier; and
at least one of the boundary lines between the module columns has a smallest angle ranging between 0° and 90° with a normal of a carrier border direction of the near border side.

3. The micromirror array of claim 2, wherein at least one of the boundary lines between the module columns has a smallest angle ranging between 0° and 45° with the normal of the carrier border direction of the near border side.

4. The micromirror array of claim 1, wherein the mirror modules are arranged in a periodic, non-Cartesian grid.

5. A component, comprising:
a micromirror array according to claim 1, wherein the component is an illumination-optical component.

6. An optical assembly, comprising:
a micromirror array according to claim 1; and
an object holder configured to hold a lithography mask in an object field,
wherein:
   the object holder is displaceable along a displacement direction;
   at one of the boundary lines between the module columns has a smallest angle ranging between 0° and 90° with a displacement direction.

7. A unit, comprising:
a micromirror array according to claim 1,
wherein the unit is an illumination optical unit, and the illumination-optical component is configured to transfer illumination light into an object field.

8. An optical system, comprising:
an illumination optical unit configured to transfer illumination light to an object field; and
a projection optical unit configured to image the object field into an image field,
wherein the illumination optical unit comprises a micromirror according to claim 1.

9. An illumination system, comprising:
a light source configured to provide illumination light; and
an illumination optical unit configured to transfer the illumination light to an object field, wherein the illumination optical unit comprises a micromirror according to claim 1.

10. A projection exposure apparatus, comprising:
a light source configured to provide illumination light;
an illumination optical unit configured to transfer the illumination light to an object field; and
a projection optical unit configured to image the object field into an image field,
wherein the illumination optical unit comprises a micromirror according to claim 1.

11. A method, comprising:
using an illumination optical unit to transfer the illumination light to an object field; and
using a projection optical unit configured to image the object field into an image field,
wherein the illumination optical unit comprises a micromirror according to claim 1.

12. A micromirror array, comprising:
a multiplicity of micromirrors arranged in groups in a plurality of mirror modules,
wherein:
   each mirror module has a rectangular module border;
   the mirror modules are arranged in module columns;
   at least some of the module columns are displaced with respect to one another along a column boundary line;
   at least some of the mirror modules adjacent to one another over the boundary line are displaced with respect to one another so that their module border sides transverse to the boundary line are not flush with one another; and
   the displacement of the module columns displaced with respect to one another along the column boundary line is less than half an extent of the respective mirror module along the column boundary line,
wherein a distance of a gap that is present between immediately neighboring micromirrors of different mirror modules is greater than a distance between immediately neighboring mirrors within a mirror module.

13. The micromirror array of claim 12, wherein:
the micromirror array is arrangeable on a carrier having a near border side closest to an arrangement region of the mirror modules of the micromirror array on the carrier; and
at least one of the boundary lines between the module columns has a smallest angle ranging between 0° and 90° with a normal of a carrier border direction of the near border side.

14. The micromirror array of claim 13, wherein at least one of the boundary lines between the module columns has a smallest angle ranging between 0° and 45° with the normal of the carrier border direction of the near border side.

15. The micromirror array of claim 12, wherein the mirror modules are arranged in a periodic, non-Cartesian grid.

16. A component, comprising:
a micromirror array according to claim 12, wherein the component is an illumination-optical component.

17. An optical assembly, comprising:
a micromirror array according to claim 12; and
an object holder configured to hold a lithography mask in an object field,
wherein:
- the object holder is displaceable along a displacement direction;
- at one of the boundary lines between the module columns has a smallest angle ranging between 0° and 90° with a displacement direction.

18. A unit, comprising:
a micromirror array according to claim 12,
wherein the unit is an illumination optical unit, and the illumination-optical component is configured to transfer illumination light into an object field.

19. An optical system, comprising:
an illumination optical unit configured to transfer illumination light to an object field; and
a projection optical unit configured to image the object field into an image field,
wherein the illumination optical unit comprises a micromirror according to claim 12.

20. An illumination system, comprising:
a light source configured to provide illumination light; and
an illumination optical unit configured to transfer the illumination light to an object field, wherein the illumination optical unit comprises a micromirror according to claim 12.

* * * * *

UNITED STATES PATENT AND TRADEMARK OFFICE
CERTIFICATE OF CORRECTION

Page 1 of 1

PATENT NO. : 12,339,589 B2
APPLICATION NO. : 18/175195
DATED : June 24, 2025
INVENTOR(S) : Michael Patra It is certified that error appears in the above-identified patent and that said Letters Patent is hereby corrected as shown below:

In the Specification

Column 3, Line 25, after "comprising" insert -- : --.

Column 4, Line 23, delete "micomirror" and insert -- micromirror --.

Column 4, Line 51, after "illumination-optical" insert -- component --.

Column 4, Line 64, delete "370" and insert -- 37° --.

Column 6, Lines 43-44, delete "Alternatively, an angle that differs from 0° is also possible between the object plane 6 and the image plane 12." and insert the same on Column 6, Line 42, as a continuation of the same paragraph.

Column 9, Line 14, delete "/+-0.125)." and insert -- +/-0.125). --.

Column 9, Line 14, delete "R" and insert -- β --.

Column 9, Line 16, delete "R" and insert -- β --.

Column 11, Line 16, delete "10," and insert -- 1°, --.

Column 12, Line 4, delete "R" and insert -- β --.

Column 13, Line 14, delete "26₁," and insert -- 26ᵢ, --.

Column 14, Line 12, delete "FIGS." and insert -- FIG. --.

Column 14, Line 20, delete "R" and insert -- β --.

Signed and Sealed this
Fifth Day of August, 2025

Coke Morgan Stewart
*Acting Director of the United States Patent and Trademark Office*